United States Patent [19]

Nguyen et al.

[11] Patent Number: 5,751,190
[45] Date of Patent: May 12, 1998

[54] GAIN-CONTROLLED AMPLIFIER AND DISTRIBUTED AMPLIFIER

[75] Inventors: Thé Linh Nguyen, Ottawa; Alois Peter Freundorfer, Kingston, both of Canada

[73] Assignee: Northern Telecom Limited, Montreal, Canada

[21] Appl. No.: 701,368

[22] Filed: Aug. 22, 1996

[51] Int. Cl.[6] .............................. H03F 3/60; H03G 3/30
[52] U.S. Cl. .............................................. 330/54; 330/254
[58] Field of Search ........................... 330/54, 254, 278, 330/279

[56] References Cited

U.S. PATENT DOCUMENTS

| 3,891,937 | 6/1975 | Bockermann et al. | 330/254 |
| 5,646,578 | 7/1997 | Loh et al. | 330/279 |

OTHER PUBLICATIONS

Maulbetsch, "Hi-Fi-Gerat MIT Fernbedienung" *Funksham*, vol. 49, No. 19, pp. 899,900, Sep. 9, 1977.

*Primary Examiner*—James B. Mullins
*Attorney, Agent, or Firm*—Angela C. de Wilton

[57] ABSTRACT

A gain-controlled amplifier has a transistor amplifier circuit and a transistor output circuit. The transistor amplifier circuit has an emitter coupled transistor pair for performing signal amplifying and another emitter coupled transistor pair which function as a current sink. The collectors of the transistors of both pairs are coupled to each other. The four transistors of the two pairs have substantially the same collector-emitter voltage vs. collector current characteristic. The output circuit is dc-coupled to the transistor amplifier circuit. An input signal to be amplified is fed to the base of a transistor which is connected to the coupled emitters of the amplifying pair of transistors. A current source is connected to the coupled emitters of the current sink pair transistors. The source current is substantially the same as the current flowing in the coupled emitters of the amplifying pair transistors. During the gain control operation, when current swings from one to the other transistor of the amplifying pair, the respective one of the current sink pair of transistors takes current and thus, the dc level of the collector of the amplifying pair of transistors is stable, with the result that the transistors of the output circuit are not saturated or cut-off. The amplifier gain is controlled by the voltage difference between a reference voltage and a variable gain control voltage which are fed to the bases of the amplifying pair transistors. The gain-controlled amplifier may be utilized in a distributed amplifier with an automatic gain control function.

9 Claims, 6 Drawing Sheets

GAIN-CONTROLLED AMPLIFIER AND DISTRIBUTED AMPLIFIER

FIELD OF THE INVENTION

The present invention relates to a gain-controlled amplifier and a distributed amplifier using the gain-controlled amplifier.

BACKGROUND OF THE INVENTION

Distributed amplifiers are used for amplifying high frequency signals. U.S. Pat. No. 4,595,881, issued Jun. 17, 1986 to Wayne Kennan, teaches a distributed amplifier using dual-gate GaAs FETs. The patent indicates an operational frequency range of 2–18 GHz. U.S. Pat. No. 5,365,197, issued Nov. 15, 1994 to Pertti K. Ikalainen, discusses a low-noise distributed amplifier utilizing FETs or GaAs HEMTs. This distributed amplifier is also intended for high frequency applications. These references relate to a distributed amplifier having a single ended output.

Hutchman et al. in "A Low Noise Distributed Amplifier with Gain Control", IEEE MTT-S Digest 1987, disclose a monolithic GaAs distributed amplifier operable on the 2 to 18 GHz range. Dual outputs are obtained by twinning two similar circuits. This method of obtaining dual outputs is inherently susceptible to noise such as power supply noise, common mode noise and ground noise.

Co-pending U.S. application Ser. No. 08/493,600 "A High Frequency, Differential Limiting Distributed Amplifier" filed by T. Y. K. Wong on Jun. 21, 1995 discloses a differential distributed amplifier.

SUMMARY OF THE INVENTION

It is an object of the present invention to provide an improved gain-controlled amplifier and an improved distributed amplifier.

According to one aspect of the invention, there is provided a gain-controlled amplifier comprising first and second transistors, the emitters of which are coupled to each other; first and second resistance elements coupled to the collectors of the first and second transistors, respectively; third and fourth transistors, the emitters of which are coupled to each other, the collectors of the third and fourth transistors being coupled to the collectors of the second and first transistors, respectively, the bases of the third and fourth transistors being coupled to the bases of the first and second transistors, respectively; means for providing an amplifier gain control signal between the bases of the first and the second transistors; first current means for providing a first coupled emitter current flowing in the coupled emitters of the first and second transistors, the first current means including a fifth transistor, the collector of which is coupled to the coupled emitters of the first and second transistors; second current means for providing a second coupled emitter current flowing in the coupled emitters of the third and fourth transistors; input means for applying a dc bias and an input signal to the base of the fifth transistor of the first current means; and output means including a sixth transistor, the base of which is dc-coupled to the collector of the second transistor, the collector of the sixth transistor being coupled to a load impedance element. In the gain-controlled amplifier, the input signal is amplified and an amplified output signal is provided from the output means.

In an example, the characteristic of collector-emitter voltage vs. collector current of the third transistor is substantially the same as that of the first transistor and the characteristic of collector-emitter voltage vs. collector current of the fourth transistor is substantially the same as that of the second transistor. The current means is a current source which is coupled to the coupled emitters of the third and fourth transistors. The current provided by the current source is substantially the same as the dc current flowing in the coupled emitters of the first and second transistors. In a case where the second transistor is turned-off or- on, for instance, in response to the amplifier gain control signal during the gain control operation, the third transistor or the second transistor takes all the current flowing in the second load resistance element. Thus, the dc level at the collector of the second transistor (i.e., the collector of the third transistor) is stable. The third and fourth transistors function as a current sink circuit. With an amplifier gain determined by the amplifier gain control signal, the input signal is amplified and the single-ended amplified voltage is provided from the collector of the second transistor. As the dc level of amplified voltage is stable, transistors of a next stage may not be saturated or cut-off during the gain control operation.

According to another aspect of the invention, there is provided a distributed amplifier comprising an input inductor circuit including a plurality of inductance elements connected in series, the input inductor circuit having first and second terminals; an output inductor circuit including a plurality of inductance elements connected in series, the output inductor circuit having first and second terminals; a plurality of gain-controlled amplifier units, each unit including a transistor amplifier and output means dc-coupled to the transistor amplifier, each unit having input and output terminals, the input terminal of each unit being coupled to the respective junction of the inductance elements of the input inductor circuit, the output terminal of each unit being coupled to the respective junction of the inductance elements of the output inductor circuit; means for providing an amplifier gain control signal to each of the gain-controlled amplifier units; an input network coupled to the second terminal of the input inductor circuit, the input network providing an input dc bias voltage to the transistor amplifier of each unit via the respective inductance elements of the input inductor circuit and functioning as an input impedance element; and an output network coupled to the first terminal of the output inductor circuit, the output network providing a dc operating voltage to the output means of each unit via the respective inductance elements of the output inductor circuit and functioning as an output impedance element. In the distributed amplifier, an input signal is fed to the first terminal of the input inductor circuit and an amplified output signal is provided from the second terminal of the output inductor circuit.

The transistor amplifier of each of the gain-controlled amplifier units comprises first and second transistors, the emitters of which are coupled to each other; first and second resistance elements coupled to the collectors of the first and second transistors, respectively; third and fourth transistors, the emitters of which are coupled to each other, the collectors of the third and fourth transistors being coupled to the collectors of the second and first transistors, respectively, the bases of the third and fourth transistors being coupled to the bases of the first and second transistors, respectively; first current means for providing a first coupled emitter current flowing in the coupled emitters of the first and second transistors, the first current means including a fifth transistor, the collector of which is coupled to the coupled emitters of the first and second transistors; second current means for providing a second coupled emitter current flowing in the coupled emitters of the third and fourth transistors; and input means coupled to the respective junction of the inductor elements of the input inductor circuit, the input means providing a dc bias in response to the input dc bias voltage from the input network and providing an ac signal in response to the input signal, the dc bias and ac signal being applied to the base of the fifth transistor of the input means.

The output means of each of the gain-controlled amplifier units comprises a sixth transistor, the base of which is dc-coupled to the collectors of the second transistor, the collector of the sixth transistor being coupled to the respective junction of the inductance elements of the output inductor circuit.

In an example of the distributed amplifier, the current means is a current source which is coupled to the coupled emitters of the third and fourth transistors. The current provided by the current source is substantially the same as the dc current flowing in the coupled emitters of the first and second transistors. During the gain control operation, the third and fourth transistors function as a current sink circuit and the dc level at the collector of the second transistor of the gain-controlled amplifier unit is stable. Thus, the fifth transistor of the output means of the gain-controlled amplifier unit, which is dc-coupled to the collectors of the second and third transistors, is not saturated or cut-off.

In another example, the distributed amplifier includes an automatic gain control feed back circuit having an ac-dc converter and a comparator. The converter detects the amplified output voltage to provide a detected dc voltage which in turn is compared by the comparator. The comparator provides the variable gain control voltage which: (i) provides increased gain of the amplifier when the detected voltage is smaller than the comparison reference voltage; and (ii) provides reduced gain of the amplifier when the detected voltage is larger than the comparison reference voltage. The gain of the gain-controlled amplifiers and the distributed amplifier is automatically controlled by the variable gain control voltage.

BRIEF DESCRIPTION OF THE DRAWINGS

The present invention will be further understood from the following description with reference to the accompanying drawings, in which.

DETAILED DESCRIPTION OF THE EMBODIMENTS

I. Prior Art Distributed Amplifier

Figure 1:
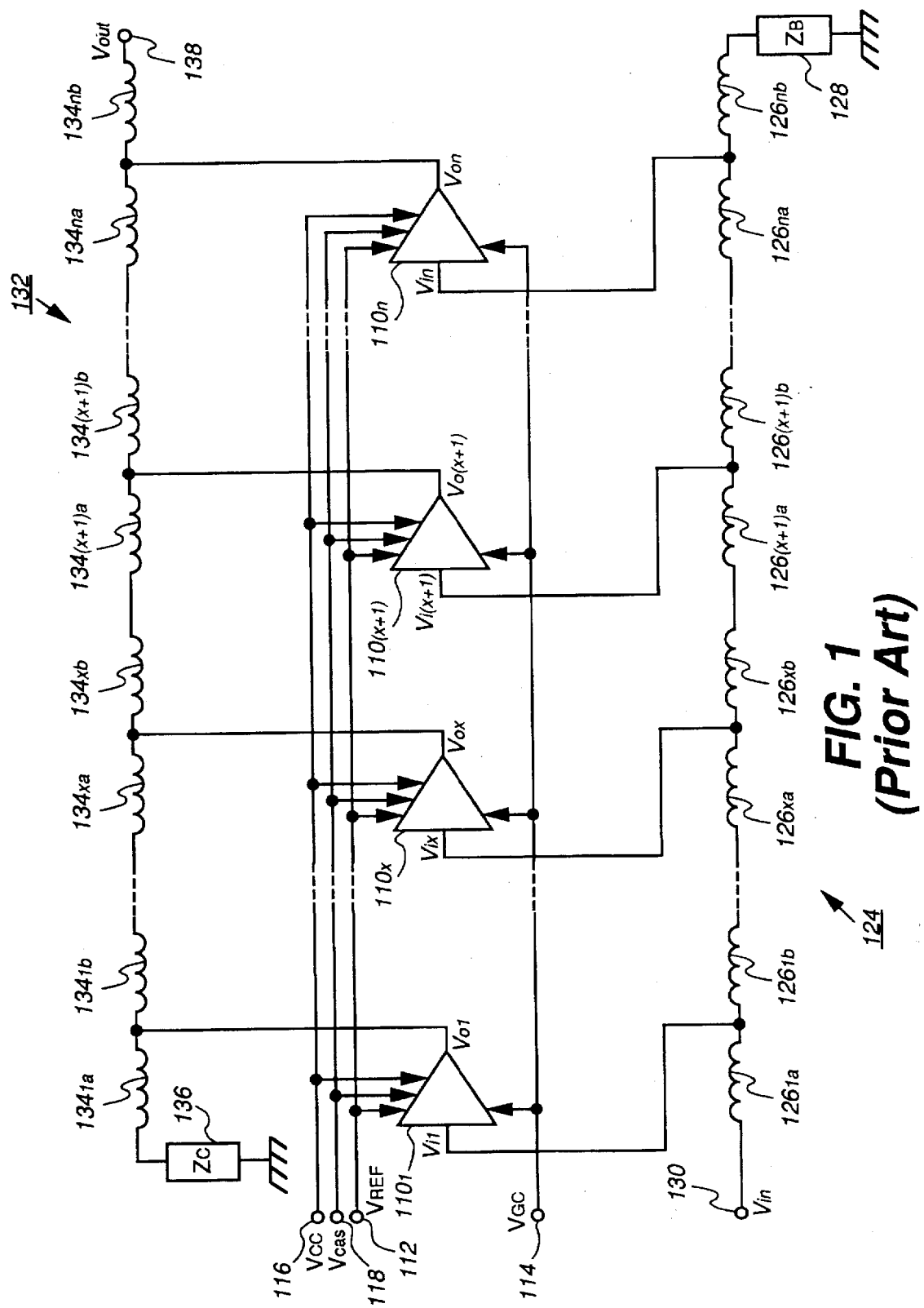
FIG. 1 shows a prior art distributed amplifier.

Referring to FIG. 1, n gain-controlled amplifiers $110_1$–$110_n$ are connected to terminals 112, 114, 116 and 118 to which a reference voltage $V_{REF}$, a gain control voltage $V_{GC}$, dc voltages $V_{CC}$ and another dc voltage $V_{cas}$ are respectively fed.

An input inductor circuit 124 having 2n series-connected inductors $126_{1a}$, $126_{1b}$, ..., $126_{na}$, $126_{nb}$ and a dc bias network 128 are connected in series between an input terminal 130 and the ground terminal. The dc bias network 128 has an impedance of 50 Ω. An output inductor circuit 132 having 2n series-connected inductors $134_{1a}$, $134_{1b}$, ..., $134_{na}$, $134_{nb}$ and another dc bias network 136 are connected in series between an output terminal 138 and the ground terminal. The dc bias network 136 has an impedance of 50 Ω. Each inductor of the inductor circuits 124 and 132 has the same inductance. The junction of the first and second inductors $126_{1a}$ and $126_{1b}$ of the input inductor circuit 124 is connected to the signal input terminal of the first gain-controlled amplifier $110^1$, the signal output terminal of which is connected to the junction of the first and second inductors $134_{1a}$ and $134_{1b}$ of the output inductor circuit 132. Similarly, the junction of the $(2n-1)^{th}$ and $(2n)^{th}$ inductors $126_{na}$ and $126_{nb}$ of the input inductor circuit 124 is connected to the signal input terminal of the $n^{th}$ gain-controlled amplifier $110_n$, the signal output terminal of which is connected to the junction of the $(2n-1)^{th}$ and $(2n)^{th}$ inductors $134_{na}$ and $134_{nb}$ of the output inductor circuit 132.

A single-ended input signal to be amplified is fed to the input terminal 130. Each of the gain-controlled amplifiers $110_1$–$110_n$ amplifies an input voltage fed to its signal input terminal and provides an amplified voltage at its signal output terminal. Eventually, an amplified signal $V_{out}$ is provided from the output terminal 138.

II. Prior Art Gain-Controlled Amplifier

Figure 2:
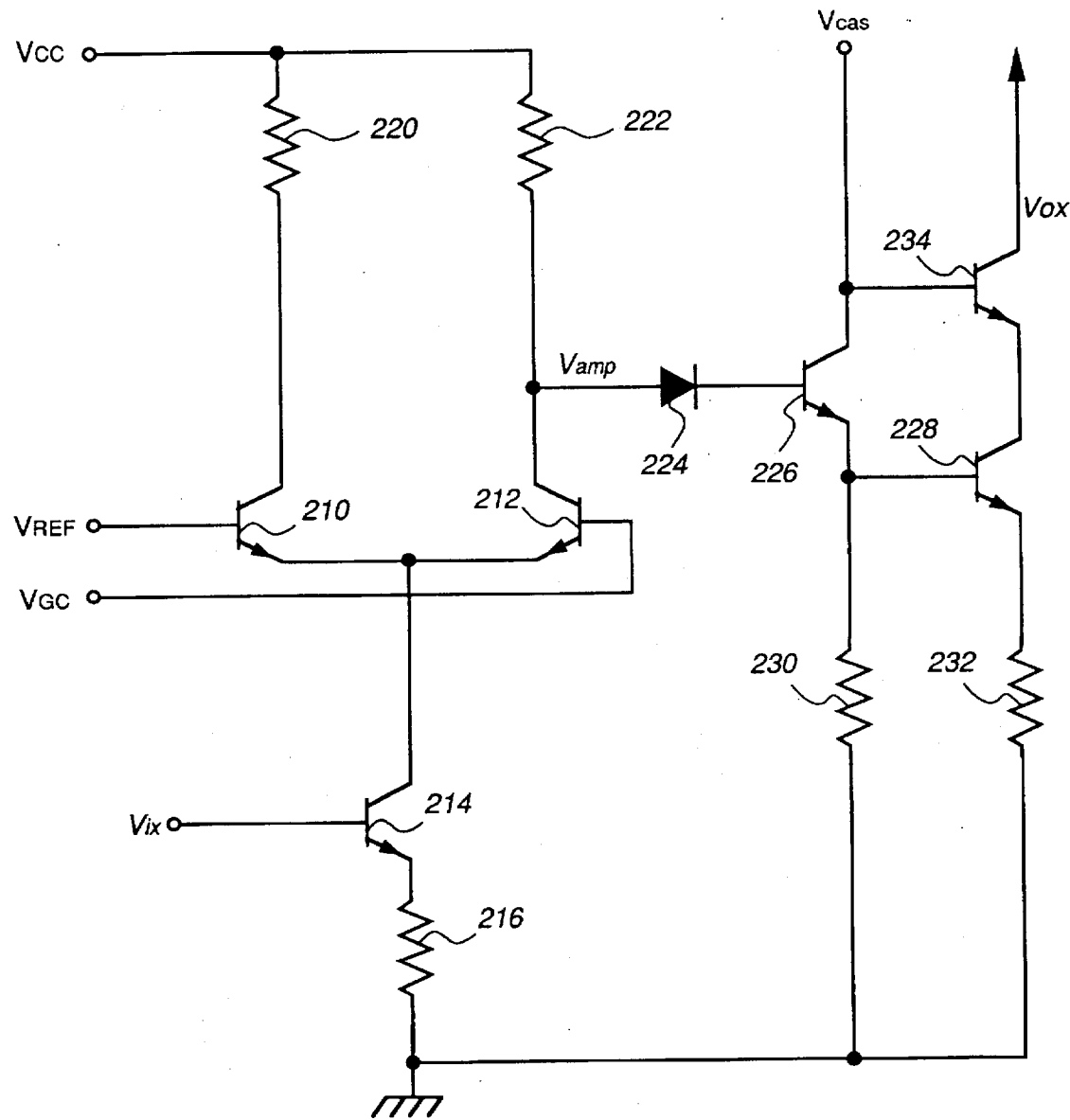
FIG. 2 shows a prior art gain-controlled amplifier.

Each of the gain-controlled amplifiers $110_1$–$110_n$ shown in FIG. 1 includes the same circuit as shown in FIG. 2, which comprises a conventional single-ended gain-controlled amplifier having an emitter coupled amplifier and a dc-coupled output circuit.

As shown in FIG. 2, the emitters of two transistors 210 and 212 of the emitter coupled amplifier are connected to the collector of a transistor 214, the emitter of which is connected via a resistor 216 to the ground terminal. The input voltage $V_{ix}$ to be amplified is fed to the signal input terminal of the gain-controlled amplifier which is connected to the base of the transistor 214.

The collectors of the transistors 210 and 212 are connected via resistors 220 and 222, respectively, to the terminal 116 of the dc voltage $V_{CC}$. The emitter coupled amplifier is connected to the dc-coupled output circuit via a diode 224. The collector of the transistor 212 is connected to the anode of the diode 224, the cathode of which is connected to the base of a transistor 226. The emitter of the transistor 226 is connected to the base of a transistor 228. The emitters of the transistors 226 and 228 are connected to the ground terminal via resistors 230 and 232, respectively. The collector of the transistor 226 is connected to the base of a transistor 234 and the terminal 118 of the dc voltage $V_{cas}$. The emitter of the transistor 234 is connected to the collector of the transistor 228. The collector of the transistor 234 is connected to the signal output terminal of the gain-controlled amplifier.

The gain control voltage $V_{GC}$ and the reference voltage $V_{REF}$ are fed to the bases of the transistors 212 and 210, respectively. In response to the voltage difference between the gain control voltage $V_{GC}$ and the reference voltage $V_{REF}$, the emitter coupled amplifier amplifies the input voltage $V_{ix}$ fed to the base of the transistor 214. A voltage $V_{amp}$ amplified by the emitter coupled amplifier is provided between the collector of the transistor 212 and the ground terminal. The amplified voltage $V_{amp}$ is fed via the diode 224 to the dc-coupled output circuit comprising the transistors 226, 228 and 234. An output voltage $V_{ox}$ is provided from the collector of the transistor 234.

During the operation of gain control in response to the gain control voltage $V_{GC}$ and the reference voltage $V_{REF}$, current swings from either one of the transistors 210 and 212 to the other may happen and the dc level at the collector of the transistor 212 may swing from "low" to "high" or vice versa. The collector of the transistor 212 of the emitter coupled amplifier is dc-coupled to the base of the transistor 226 of the dc-coupled output circuit via the diode 224. Therefore, the dc level of the base of the transistor 226 follows the dc level at the collector of the transistor 212 and the transistor 226 may be saturated or cut-off, with the result that the output voltage $V_{ox}$ may not be properly provided.

III. Distributed Amplifier

Figure 3:
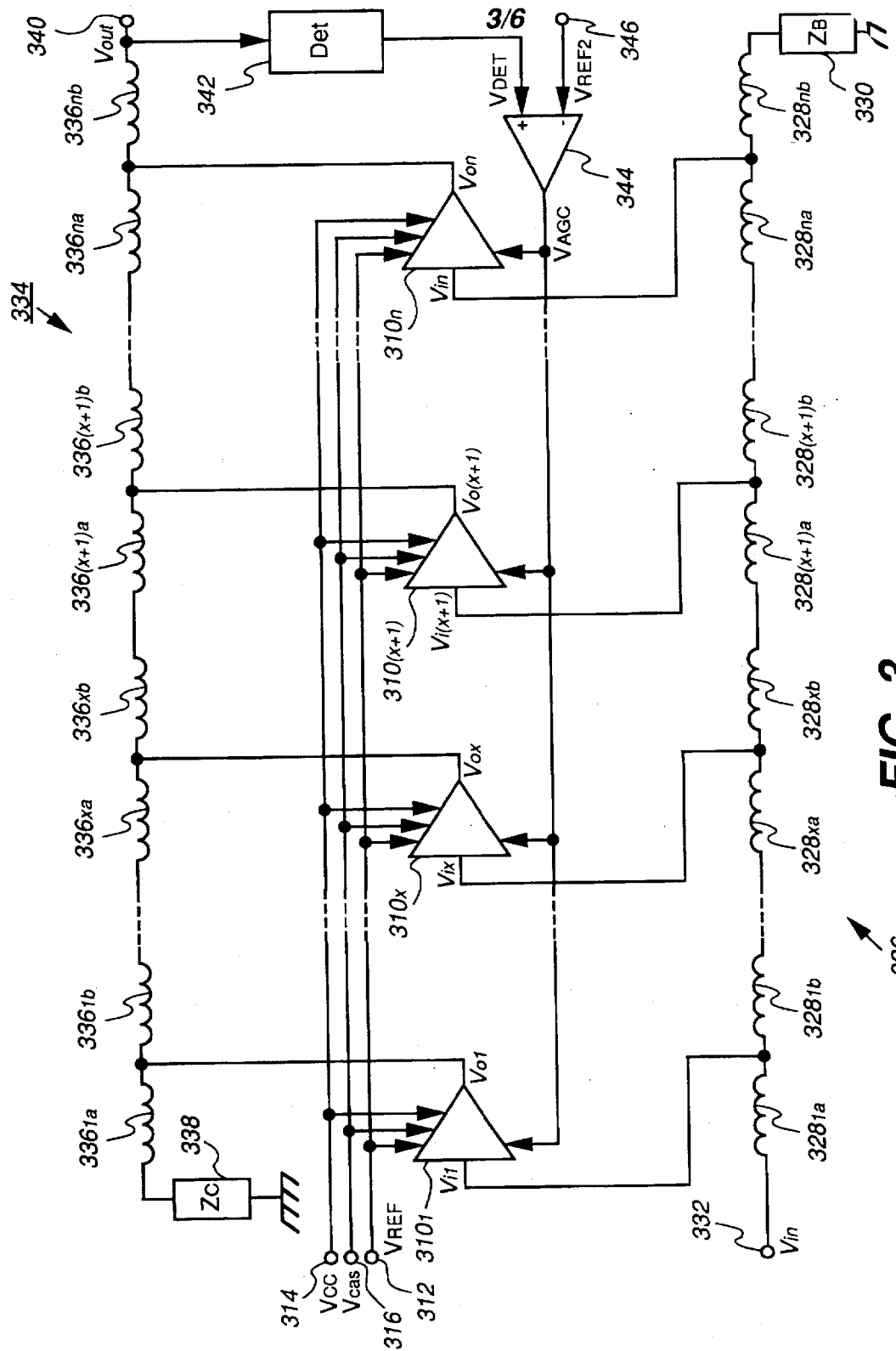
FIG. 3 shows a distributed amplifier according to an embodiment of the present invention.

FIG. 3 shows a distributed amplifier according to an embodiment of the present invention, which includes a plurality of gain-controlled amplifiers, a pair of series-connected inductance elements and impedance elements. The following description assumes, for simplicity and purely by way of example, that transistors are npn-type bipolar transistors. Dc voltages $V_{CC}$ and $V_{cas}$ are +5.5 and +2.7 volts, respectively. A reference voltage $V_{REF}$ is +3.3 volts. An automatic gain control (AGC) voltage $V_{AGC}$ may vary between +3.16 and +3.44 volts.

In FIG. 3, each of n gain-controlled amplifiers $310_1$–$310_n$ has a transistor amplifier circuit and an output circuit which is dc-coupled to the transistor amplifier circuit. Each gain-controlled amplifier has signal input and output terminals and voltage terminals. The voltage terminals of the gain-controlled amplifiers $310_1$–$310_n$ are connected to terminals 312, 314 and 316 to which the reference voltage $V_{REF}$, the dc voltage $V_{CC}$ and the dc voltage $V_{cas}$ are respectively fed. These voltages $V_{REF}$, $V_{CC}$ and $V_{cas}$ are fed to the transistor amplifier circuits of the gain-controlled amplifiers $310_1$–$310_n$.

An input inductor circuit 326 having 2n series-connected inductors $328_{1a}$, $328_{1b}$, ..., $328_{na}$, $328_{nb}$ and a dc bias network 330 are connected in series between an input terminal 332 and the ground terminal. The dc bias network 330 provides an input dc bias voltage to each of the n gain-controlled amplifiers $310_1$–$310_n$ and functions as an input impedance network of $Z_B$ (=50 Ω) for each of the gain-controlled amplifiers $310_1$–$310_n$. An output inductor circuit 334 having 2n series-connected inductors $336_{1a}$, $336_{1b}$, ..., $336_{na}$, $336_{nb}$ and another dc bias network 338 are connected in series between an output terminal 340 and the ground terminal. The dc bias network 338 provides a dc voltage for the output circuit of each of the n gain-controlled amplifiers $310_1$–$310_n$, and functions as an output impedance network of $Z_c$ (=50 Ω) for each of the gain-controlled amplifiers $310_1$–$310_n$. Each inductor of the inductor circuits 326 and 334 has an inductance L.

The signal input terminal of the first gain-controlled amplifier $310_1$ is connected to the junction of the first and second inductors $328_{1a}$ and $328_{1b}$ of the input inductor circuit 326. The signal output terminal of the first gain-controlled amplifier $310_1$ is connected to the junction of the first and second inductors $336_{1a}$ and $336_{1b}$ of the output inductor circuit 334. Similarly, the signal input terminal of the $n^{th}$ gain-controlled amplifier $310_n$ is connected to the junction of the $(2n-1)^{th}$ and $n^{th}$ inductors $328_{na}$ and $328_{nb}$ of the input inductor circuit 326. The signal output terminal of the $n^{th}$ gain-controlled amplifier $310_n$ is connected to the junction of the $(2n-1)^{th}$ and $(2n)^{th}$ inductors $336_{na}$ and $336_{nb}$ of the output inductor circuit 334. In general, at the $x^{th}$ stage, the signal input and output terminals of the $x^{th}$ gain-controlled amplifier $310_x$ are connected to the junctions of the inductors $328_{xa}$, $328_{xb}$ and of the inductors $336_{xa}$, $336_{xb}$, respectively. At the next $(x+1)^{th}$ stage, the signal input and output terminals of the $(x+1)^{th}$ gain-controlled amplifier $310_{(x+1)}$ are connected to the junctions of the inductors $328_{(x+1)a}$, $328_{(x+1)b}$ and of the inductors $336_{(x+1)a}$, $336_{(x+1)b}$, respectively. The inductors $328_{xb}$ and $328_{(x+1)a}$ of the input inductor circuit 326 are connected in series. The inductors $336_{xb}$ and $336_{(x+1)a}$ of the output inductor circuit 334 are connected in series.

A single-ended input signal $V_{in}$ to be amplified is applied between the input terminal 332 and the ground terminal. Each of the gain-controlled amplifiers $310_1$–$310_n$ amplifies an input voltage fed to its signal input terminal and provides an amplified voltage at its signal output terminal. Eventually, an amplified signal $V_{out}$ is provided between the output terminal 340 and the ground terminal.

The distributed amplifier has an automatic gain control (AGC) function. The entire amplifier is a delayed AGC amplifier and includes a detector/filter 342 and a voltage control amplifier 344 in a negative feedback loop. The output terminal 340 is connected to the input terminal of the detector/filter 342, the output terminal of which is connected to a non-inverter terminal of the voltage control amplifier 344. An inverter terminal of the voltage control amplifier 344 is connected to a terminal 346 to which a reference voltage $V_{REF2}$ is fed.

IV. Gain-Controlled Amplifiers

Figure 4:
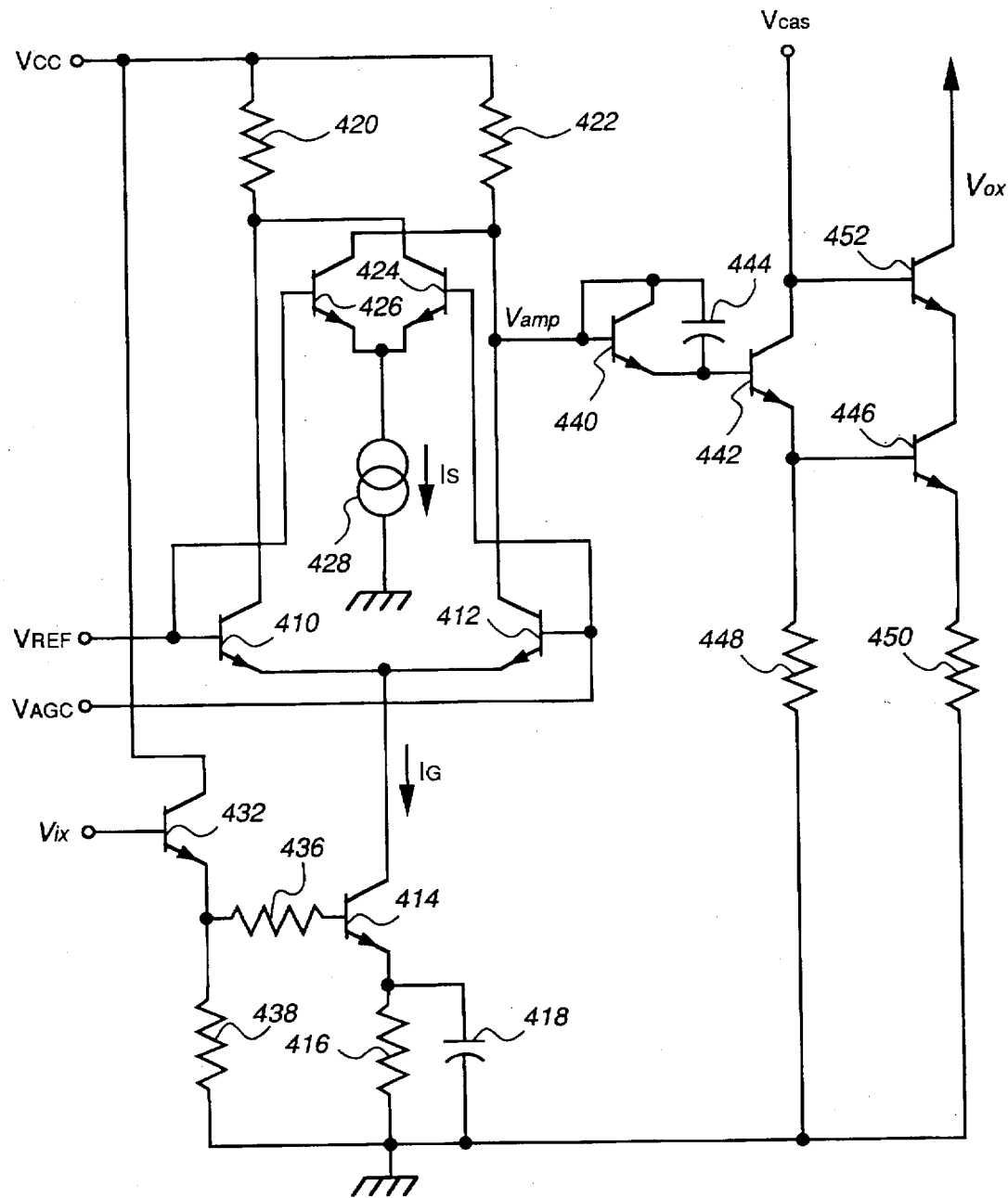
FIG. 4 shows a gain-controlled amplifier according to an embodiment of the present invention.

Each of the gain-controlled amplifiers $310_1$–$310_n$ shown in FIG. 3 includes the same circuit as shown in FIG. 4. FIG. 4 shows a single-ended gain-controlled amplifier according to an embodiment of the present invention.

As shown in FIG. 4, the emitters of two transistors 410 and 412 of one emitter coupled transistor pair are connected to the collector of a transistor 414, the emitter of which is connected via a parallel-connected resistor 416 and capacitor 418 to the ground terminal. The collectors of the transistors 410 and 412 are connected via resistors 420 and 422, respectively, to the terminal 314 of the dc voltage $V_{CC}$. The collectors of the transistors 410 and 412 are also connected to the collectors of transistors 424 and 426, respectively, of another emitter coupled transistor pair. The emitters of the transistors 424 and 426 are connected to a current source 428. The bases of the transistors 424 and 426 are connected to the bases of the transistors 412 and 410, respectively. The base of the transistor 410 is connected to the terminal 312 of the reference voltage $V_{REF}$. The base of the transistor 412 is connected to the output terminal of the voltage control amplifier 344.

The base of the transistor 432 is connected to the signal input terminal of the gain-controlled amplifier, which is connected to the junction of the respective inductors of the input inductor circuit 326. The input voltage $V_{ix}$ is fed to the signal input terminal. The collector of the transistor 432 is connected to the terminal 314 of the dc voltage $V_{CC}$. The emitter of the transistor 432 is connected to the base of the transistor 414 via a resistor 436 and to the ground terminal via a resistor 438.

The emitter coupled amplifier is connected to the dc-coupled output circuit via a transistor 440, instead of the diode. The collector of the transistor 412 is connected to the base and collector of the transistor 440, the emitter of which is connected to the base of a transistor 442. A capacitor 444 is connected between the collector and the emitter of the transistor 440. The emitter of the transistor 442 is connected to the base of a transistor 446. The emitters of the transistors 442 and 446 are connected to the ground terminal via resistors 448 and 450, respectively. The collector of the transistor 442 is connected to the terminal 316 of the dc voltage $V_{cas}$ and the base of a transistor 452, the emitter of which is connected to the collector of the transistor 446. The collector of the transistor 452 is connected to the respective junction of the inductors of the output inductor circuit 334.

Examples of values of the components are:
Resistance of the resistor 416: 50 Ω
Resistance of the resistor 420: 100 Ω
Resistance of the resistor 422: 100 Ω
Resistance of the resistor 436: 15 Ω
Resistance of the resistor 438: 750 Ω
Resistance of the resistor 448: 1.5 kΩ
Resistance of the resistor 450: 10 Ω
Capacitance of the capacitor 418: 0.14 µF
Capacitance of the capacitor 444: 0.35 µF The transistors 410 and 426 are chosen so that they have matched characteristic of collector-emitter voltage vs. collector current. Similarly, the transistors 412 and 424 are chosen so that they have matched characteristic of collector-emitter voltage vs. collector current. Ideally, four transistors 410, 412, 424 and 426 have the same characteristic of collector-emitter voltage vs. collector current.

Operation of the embodiment gain-controlled amplifier will now be described.

The emitter coupled amplifier is designed so that the current $I_s$ of the current source 428 and the dc current $I_G$ flowing in the coupled emitters of the transistors 410 and 412 are substantially the same.

In response to the input voltage $V_{in}$, the current flowing in the collector of the transistor 412 varies. Thus, the input voltage is amplified and the amplified voltage $V_{amp}$ is provided between the collector of the transistor 412 and the ground terminal. The voltage gain of the emitter coupled amplifier is determined by the voltage difference between the AGC voltage $V_{AGC}$ and reference voltage $V_{REF}$.

When the AGC voltage $V_{AGC}$ is far more positive than the reference voltage $V_{REF}$, current flows in the transistor 412 and no current flows in the transistor 410. In this case, all the current flowing in the resistor 422 is taken by the on transistor 412 and all the current flowing in the resistor 420 is taken by the transistor 424. In a case where the AGC voltage $V_{AGC}$ decreases rapidly, the transistor 412 is turned-off, resulting in no current flowing therein. All the current flowing in the resistor 422 sinks into the transistor 426.

On the other hand, when the AGC voltage $V_{AGC}$ is far below the reference voltage $V_{REF}$, current flows in the transistor 410 and no current flows in the transistor 412. In this case, all the current flowing in the resistor 420 is taken by the on transistor 410 and all the current flowing in the resistor 422 is taken by the transistor 426. In a case where the AGC voltage $V_{AGC}$ increases rapidly, the transistor 410 is turned-off, resulting in no current flowing therein. All the current flowing in the resistor 420 sinks into the transistor 424.

The transistors 424 and 426 function as current sink circuits and the dc level at the collector of the transistor 412 is stable while current swings between the transistor 410 and the transistor 412. Thus, the dc level of the base of the transistor 442 is also stable and the transistors 442, 446 and 452 are not saturated or cut-off. The output voltage $V_{ox}$ is properly provided from the gain-controlled amplifier.

The detector/filter 342 is operable on the order of 10 GHz range. The detector/filter 342 detects the amplified output voltage $V_{out}$ and converts to a detected voltage $V_{DET}$ which is provided to the non-inverter terminal of the voltage control amplifier 344. The voltage control amplifier 344 compares the detected voltage $V_{DET}$ to the reference voltage $V_{REF2}$ and provides the AGC voltage $V_{AGC}$ to the base of the transistor 412 of each of the n gain-controlled amplifiers $310_1$–$310_n$. The AGC voltage $V_{AGC}$ is determined by the voltage difference between the detected voltage $V_{DET}$ and the reference voltage $V_{REF2}$. When the detected voltage $V_{DET}$ is smaller than the reference voltage $V_{REF2}$, the voltage control amplifier 344 provides the AGC voltage, $V_{AGC}$ being variable and therefore the gain of the amplifier variably increases. In a case where the detected voltage $V_{DET}$ goes beyond the reference voltage $V_{REF2}$, however, the voltage control amplifier 344 lessens the AGC voltage $V_{AGC}$ dependent upon the detected voltage $V_{DET}$ and therefore, the gain of the amplifier is variably lessened. Although current swings between the transistors 410 and 412 during the AGC operation, the current flowing in the resistor 420 or 422 sinks into the transistor 424 or 426 and thus, the AGC is achieved without the transistors 442, 446 and 452 of the dc-coupled output circuit being saturated or cut-off.

The AGC negative feedback loop may include an amplifier to increase a control sensitivity. The detector may include an average or a peak detector.

Figure 5:
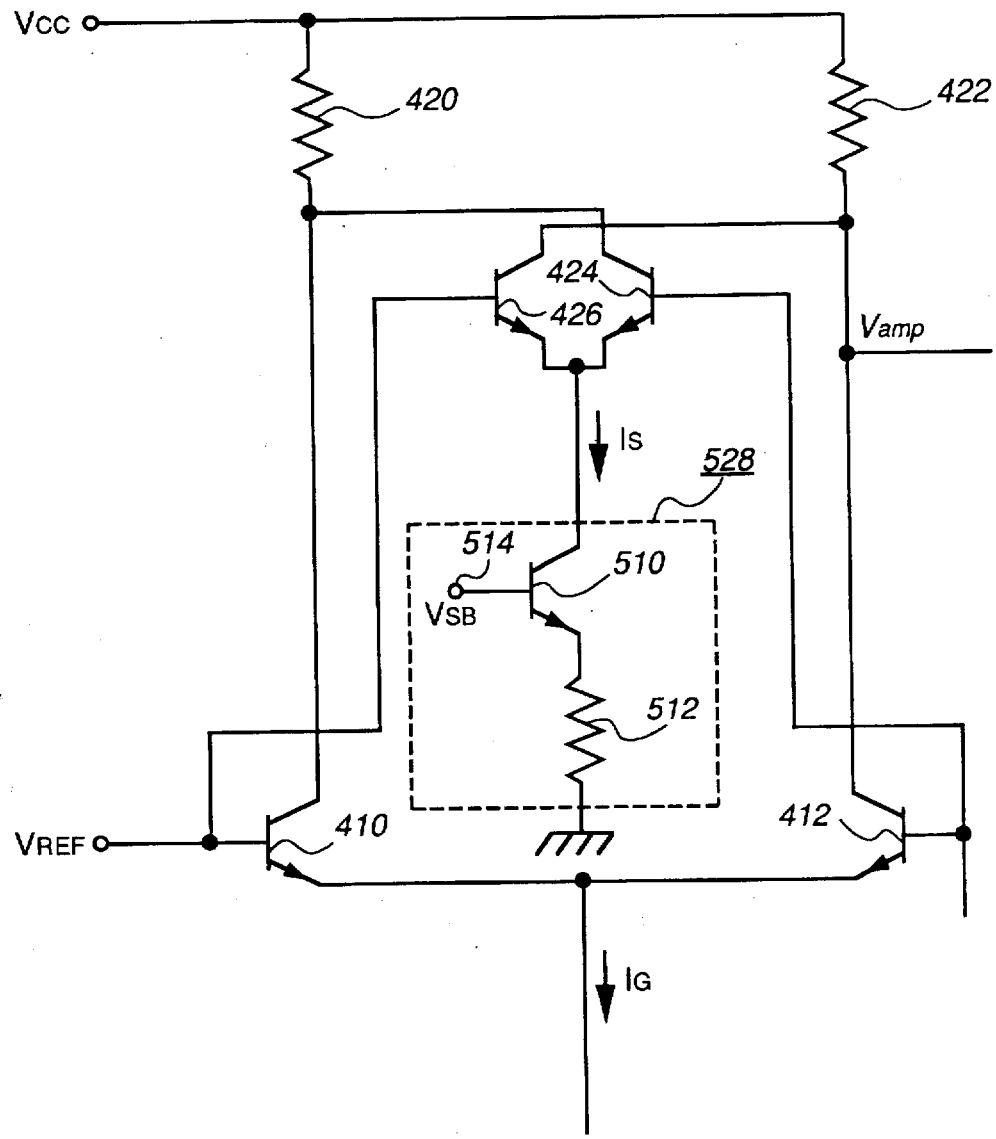
FIG. 5 shows an example of a current source shown in FIG. 4.

FIG. 5 shows an example of the current source shown in FIG. 4. In FIG. 5, a current source 528 is provided with a transistor 510 and a resistor 512. The coupled emitters of the transistors 424 and 426 are connected to the collector of the transistor 510, the emitter of which is connected to the ground terminal via the resistor 512. The base of the transistor 510 is connected to a terminal 514 to which a current control voltage $V_{SB}$ is fed. A constant current $I_S$ flows in the coupled emitters of the transistors 424 and 426, dependent upon the current control voltage $V_{SB}$. The current $I_S$ is selected to be equal to the current $I_G$ flowing in the coupled emitters of the transistors 410 and 412.

Figure 6:
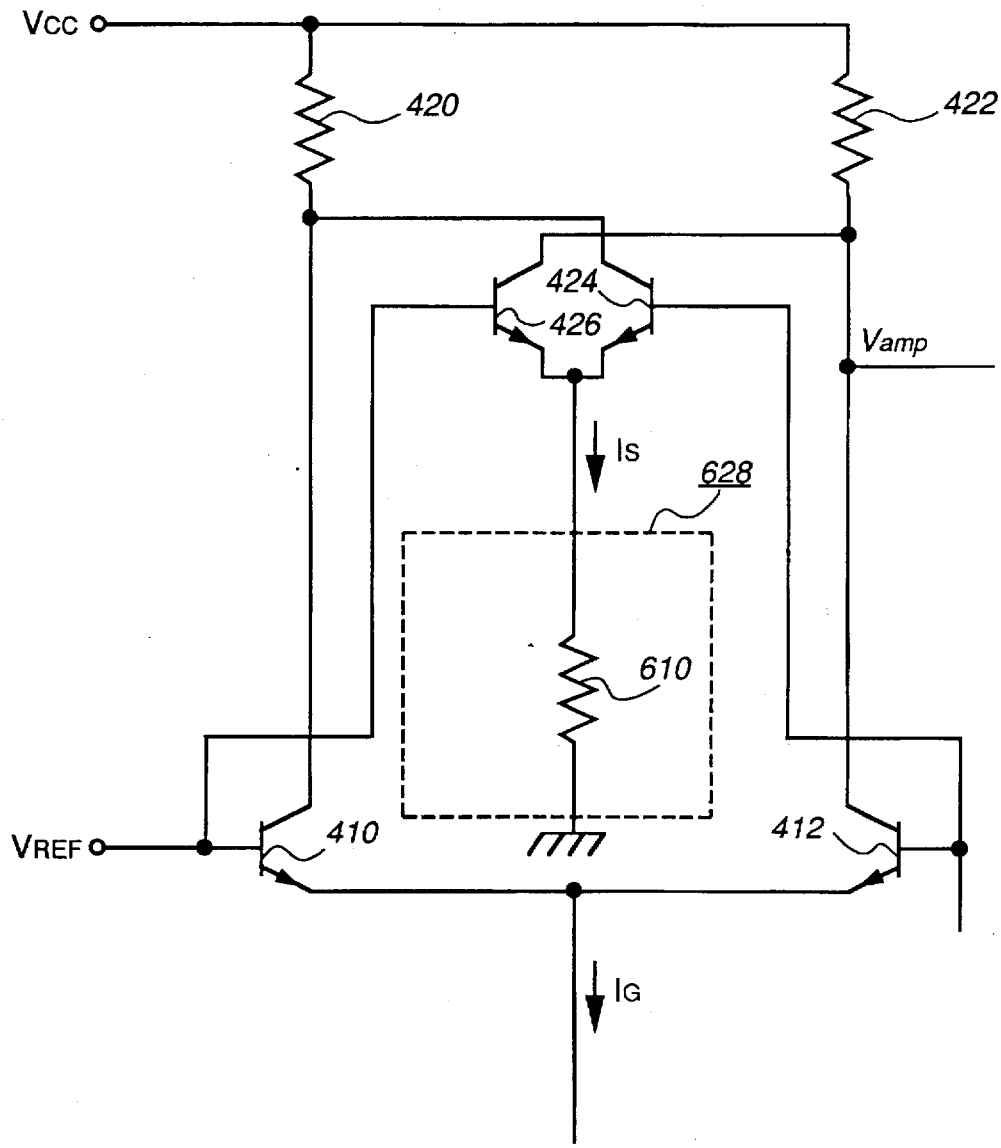
FIG. 6 shows another example of the current source shown in FIG. 4.

FIG. 6 shows another example of the current. A current source 628 is provided with a resistor 610 which is connected between the coupled emitters of the transistors 424 and 426 and the ground terminal. Operation of the gain-controlled amplifier shown in FIG. 6 is similar to that of the circuit shown in FIG. 5.

There are many other variations of the current source which provides a dc current to the emitter coupled transistors 424 and 426, the dc current $I_S$ being substantially equal to the dc current $I_G$ flowing in the emitter coupled transistors 410 and 412. Another typical example is a current mirror circuit.

Although particular embodiments of the present invention have been described in detail, it should be appreciated that numerous variations, modifications, and adaptations may be made without departing from the scope of the present invention as defined in the claims. For instance, pnp-type transistors, instead of npn-type transistors, may be used. The values of the components and voltages may be varied dependent upon the circuit designs.

What is claimed is:

1. A distributed amplifier comprising:
   an input inductor circuit including a plurality of inductance elements connected in series, the input inductor circuit having first and second terminals;
   an output inductor circuit including a plurality of inductance elements connected in series, the output inductor circuit having first and second terminals;
   a plurality of gain-controlled amplifier units, each unit including a transistor amplifier and output means dc-coupled to the transistor amplifier, each unit having input and output terminals, the input terminal of each unit being coupled to the respective junction of the inductance elements of the input inductor circuit, the output terminal of each unit being coupled to the respective junction of the inductance elements of the output inductor circuit;

means for providing an amplifier gain control signal to each of the gain-controlled amplifier units;

an input network coupled to the second terminal of the input inductor circuit, the input network providing an input dc bias voltage to the transistor amplifier of each unit via the respective inductance elements of the input inductor circuit and functioning as an input impedance element; and an output network coupled to the first terminal of the output inductor circuit, the output network providing a dc operating voltage to the output means of each unit via the respective inductance elements of the output inductor circuit and functioning as an output impedance element, wherein an input signal is fed to the first terminal of the input inductor circuit and an amplified output signal is provided from the second terminal of the output inductor circuit, the transistor amplifier of each of the gain-controlled amplifier units comprising:

first and second transistors, the emitters of which are coupled to each other;

first and second resistance elements coupled to the collectors of the first and second transistors, respectively;

third and fourth transistors, the emitters of which are coupled to each other, the collectors of the third and fourth transistors being coupled to the collectors of the second and first transistors, respectively, the bases of the third and fourth transistors being coupled to the bases of the first and second transistors, respectively;

first current means for providing a first coupled emitter current flowing in the coupled emitters of the first and second transistors, the first current means including a fifth transistor, the collector of which is coupled to the coupled emitters of the first and second transistors;

second current means for providing a second coupled emitter current flowing in the coupled emitters of the third and fourth transistors; and input means coupled to the respective junction of the inductor elements of the input inductor circuit, the input means providing a dc bias in response to the input dc bias voltage from the input network and providing an ac signal in response to the input signal, the dc bias and ac signal being applied to the base of the fifth transistor of the input means, the output means of each of the gain-controlled amplifier units comprising a sixth transistor, the base of which is dc-coupled to the collector of the second transistor, the collector of the sixth transistor being coupled to the respective junction of the inductance elements of the output inductor circuit.

2. The distributed amplifier of claim 1, wherein the first coupled emitter current is substantially equal to the second coupled emitter current.

3. The distributed amplifier of claim 1, wherein the first and third transistors have substantially the same collector-emitter voltage vs. collector current characteristic and the second and fourth transistors have substantially the same collector-emitter voltage vs. collector current characteristic.

4. The distributed amplifier of claim 1, wherein the first, second, third and fourth transistors have substantially the same collector-emitter voltage vs. collector current characteristic.

5. The distributed amplifier of claim 1, wherein the input means includes an emitter follower circuit having a seventh transistor, the ac signal being provided to the base of the seventh transistor, an output signal of the emitter follower circuit being provided to the base of the fifth transistor.

6. The distributed amplifier of claim 1, wherein the second current means includes an eighth transistor, the collector of which is coupled to the coupled emitters of the third and fourth transistors, the collector current of the eighth transistor being varied dependent upon a voltage fed to the base of the eighth transistor.

7. The distributed amplifier of claim 1, wherein the amplifier gain control signal comprises a variable gain control voltage and a reference voltage, the variable gain control voltage being fed to the bases of the second and fourth transistors, the reference voltage being fed to the base of the first and third transistors, the gain of the gain-controlled amplifier being determined by the voltage difference between the variable gain control voltage and the reference voltage.

8. The distributed amplifier of claim 7, further comprising feedback means for providing the variable gain control voltage in response to the amplified output signal provided from the second terminal of the output inductor circuit, the feedback means comprising:

ac-dc conversion means for providing a detected voltage in response to the amplified output signal; and comparison means for comparing the detected voltage to a comparison reference voltage to provide the variable gain control voltage.

9. The distributed amplifier of claim 8, wherein the variable gain control voltage:

(i) provides increased gain of the amplifier when the detected voltage is smaller than the comparison reference voltage; and (ii) provides reduced gain of the amplifier when the detected voltage is larger than the comparison reference voltage.

* * * * *